(12) United States Patent
Cho et al.

(10) Patent No.: US 12,125,742 B2
(45) Date of Patent: Oct. 22, 2024

(54) PACKAGE COMPRISING A SUBSTRATE WITH HIGH DENSITY INTERCONNECTS

(71) Applicant: QUALCOMM Incorporated, San Diego, CA (US)

(72) Inventors: Hyunchul Cho, Suwon (KR); Kun Fang, San Diego, CA (US); Jaehyun Yeon, San Diego, CA (US); Suhyung Hwang, Rancho Mission Viejo, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 491 days.

(21) Appl. No.: 17/479,691

(22) Filed: Sep. 20, 2021

(65) Prior Publication Data

US 2023/0093681 A1 Mar. 23, 2023

(51) Int. Cl.
| | |
|---|---|
| *H01L 21/768* | (2006.01) |
| *H01L 21/48* | (2006.01) |
| *H01L 21/56* | (2006.01) |
| *H01L 23/00* | (2006.01) |
| *H01L 23/498* | (2006.01) |

(52) U.S. Cl.
CPC ...... *H01L 21/76816* (2013.01); *H01L 21/486* (2013.01); *H01L 21/56* (2013.01); *H01L 23/49816* (2013.01); *H01L 24/05* (2013.01); *H01L 24/13* (2013.01); *H01L 24/81* (2013.01); *H01L 2224/04105* (2013.01); *H01L 2224/16227* (2013.01)

(58) Field of Classification Search
CPC ................................................. H01L 21/76816
See application file for complete search history.

(56) References Cited

U.S. PATENT DOCUMENTS

| | | |
|---|---|---|
| 10,410,970 B1 | 9/2019 | Chiu et al. |
| 2020/0135839 A1* | 4/2020 | Kang ................. H01L 21/6835 |
| 2020/0395346 A1 | 12/2020 | Jung et al. |

OTHER PUBLICATIONS

International Search Report and Written Opinion—PCT/US2022/039610—ISA/EPO—Dec. 23, 2022.

* cited by examiner

*Primary Examiner* — William A Harriston
(74) *Attorney, Agent, or Firm* — Loza & Loza, LLP

(57) ABSTRACT

A package that includes a substrate, a first integrated device coupled to a first surface of the substrate, and a second integrated device coupled to a second surface of the substrate. The substrate includes at least one dielectric layer, a first plurality of high-density interconnects located in the at least one dielectric layer and through a first surface of the at least one dielectric layer; a second plurality of high-density interconnects located in the at least one dielectric.

23 Claims, 11 Drawing Sheets

CROSS SECTIONAL PROFILE VIEW

CROSS SECTIONAL PROFILE VIEW

CROSS SECTIONAL PROFILE VIEW

CROSS SECTIONAL PROFILE VIEW

PACKAGE COMPRISING A SUBSTRATE WITH HIGH DENSITY INTERCONNECTS

FIELD

Various features relate to packages with a substrate.

BACKGROUND

A package may include a substrate and integrated devices. These components are coupled together to provide a package that may perform various electrical functions. There is an ongoing need to provide better performing packages and reduce the overall size of packages.

SUMMARY

Various features relate to packages with a substrate.

One example provides a package that includes a substrate, a first integrated device coupled to a first surface of the substrate and a second integrated device coupled to a second surface of the substrate. The substrate includes at least one dielectric layer; a first plurality of interconnects located in the at least one dielectric layer and through the first surface of the at least one dielectric layer; and a second plurality of interconnects located in the at least one dielectric layer and through the second surface of the at least one dielectric layer. The first plurality of interconnects includes a first width and a first spacing. The second plurality of interconnects includes a second width and a second spacing. The substrate includes a third plurality of interconnects located in the at least one dielectric layer. The third plurality of interconnects includes a third width that is greater than the first width and the second width. The third plurality of interconnects includes a third spacing that is greater than the first spacing and the second spacing.

Another example provides an apparatus that includes a substrate, a first integrated device coupled to a first surface of the substrate, and a second integrated device coupled to a second surface of the substrate. The substrate includes at least one dielectric layer, means for first high-density interconnection located in the at least one dielectric layer and through the first surface of the at least one dielectric layer, means for second high-density interconnection located in the at least one dielectric layer and through the second surface of the at least one dielectric layer.

Another example provides a method for fabricating a substrate. The method provides a first carrier comprising a first seed layer. The method forms a first plurality of high-density interconnects over the first seed layer. The method forms a first dielectric layer over the first plurality of high-density interconnects. The method forms a plurality of interconnects in and/or over the first dielectric layer. The method provides a second carrier comprising a second seed layer. The method forms a second plurality of high-density interconnects over the second seed layer. The method couples the second carrier comprising the second seed layer and the second plurality of high-density interconnects, to the first carrier comprising the first seed layer, the first plurality of high-density interconnects, the first dielectric layer and the plurality of interconnects, through a second dielectric layer. The method decouples the second carrier and the first carrier. The method removes portions of the first seed layer and portions of the second seed layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first integrated device coupled to a first surface of the substrate, and a second integrated device coupled to a second surface of the substrate. The substrate includes at least one dielectric layer, a first plurality of high-density interconnects located in the at least one dielectric layer and through the first surface of the at least one dielectric layer, a second plurality of high-density interconnects located in the at least one dielectric layer and through the second surface of the at least one dielectric layer, and a solder resist layer located over the at least one dielectric layer. The use of the first plurality of high-density interconnects over a first side of the substrate, and the second plurality of high-density interconnects over a second side of the substrate, helps provide high-density and high-speed communication for integrated devices, while reducing the overall height and/or size of the package.

Exemplary Package Comprising a Substrate with High-Density Interconnects

Figure 1:
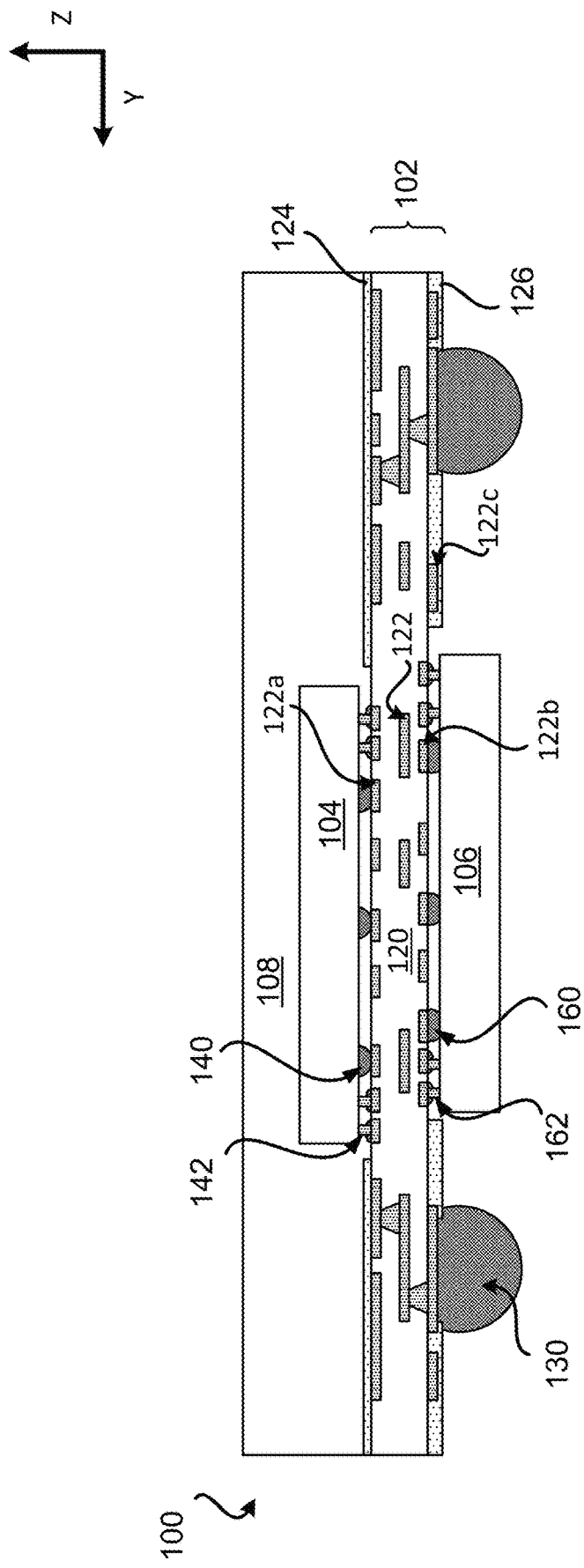
FIG. 1 illustrates a cross sectional profile view of a package that includes a substrate with high-density interconnects.

FIG. 1 illustrates a cross sectional profile view of a package 100 that includes a substrate with high-density interconnects. The package 100 includes a substrate 102, an integrated device 104, an integrated device 106, and an encapsulation layer 108.

The substrate 102 includes at least one dielectric layer 120, a plurality of interconnects 122, a solder resist layer 124, and a solder resist layer 126. The substrate 102 may be a coreless substrate. The substrate 102 may include a first surface (e.g., top surface) and a second surface (e.g., bottom surface). As will be further described below, the substrate 102 includes a plurality of high-density interconnects located on a first side (e.g., top side) of the substrate 102, and a plurality of high-density interconnects located on a second side (e.g., bottom side) of the substrate 102. The plurality of interconnects 122 may include a plurality of interconnects 122a, a plurality of interconnects 122b, and a plurality of interconnects 122c. The use of the high-density interconnects on both sides of the substrate 102 allows for more electrical connections (e.g., denser electrical routing) to/from the integrated devices in a smaller space, enabling high-speed communication, while still reducing the size of the package.

The plurality of interconnects 122a includes a plurality of high-density interconnects. The plurality of interconnects 122a may include interconnects located on a top metal layer of the substrate 102, such as the M1 layer (e.g., first metal layer). The plurality of interconnects 122a may be embedded in the at least one dielectric layer 120. The plurality of interconnects 122a may be located in the first metal layer embedded in the at least one dielectric layer 120. The plurality of interconnects 122a includes a minimum width of about 3-4 micrometers, and a minimum spacing of about 3-4 micrometers. The plurality of interconnects 122a may include at least one interconnect with a width of about 3-4 micrometers or greater. The plurality of interconnects 122a may include at least one interconnect with a spacing of about 3-4 micrometers or greater.

The plurality of interconnects 122b includes a plurality of high-density interconnects. The plurality of interconnects 122b may include interconnects located on a next to bottom metal layer (e.g., next to last metal layer, M3 layer) of the substrate 102. The plurality of interconnects 122b may be embedded in the at least one dielectric layer 120. The plurality of interconnects 122b may be located in the last metal layer embedded in the at least one dielectric layer 120. The plurality of interconnects 122b includes a minimum width of about 3-4 micrometers, and a minimum spacing of about 3-4 micrometers. The plurality of interconnects 122b may include at least one interconnect with a width of about 3-4 micrometers or greater. The plurality of interconnects 122b may include at least one interconnect with a spacing of about 3-4 micrometers or greater.

The plurality of interconnects 122c may be located in the at least one dielectric layer 120. The plurality of interconnects 122c may be located over a bottom surface of the at least one dielectric layer 120. The plurality of interconnects 122c may be surrounded by the solder resist layer 126. The plurality of interconnects 122c includes a minimum width of about 8 micrometers, and a minimum spacing of about 8 micrometers. The plurality of interconnects 122c may include at least one interconnect with a width of about 8 micrometers or greater. The plurality of interconnects 122c may include at least one interconnect with a spacing of about 8 micrometers or greater.

Figure 2:
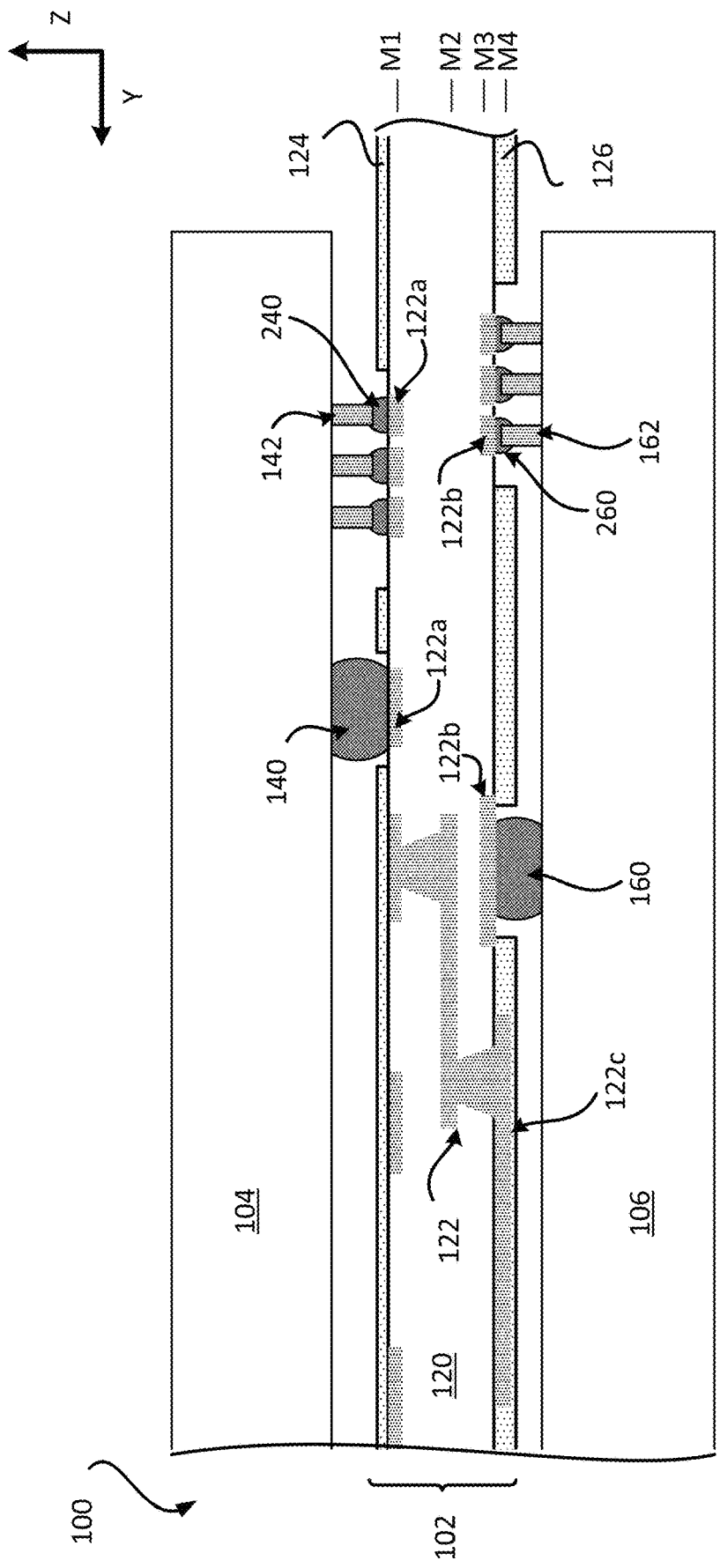
FIG. 2 illustrates a close-up view of a package that includes a substrate with high-density interconnects.
Figure 3:
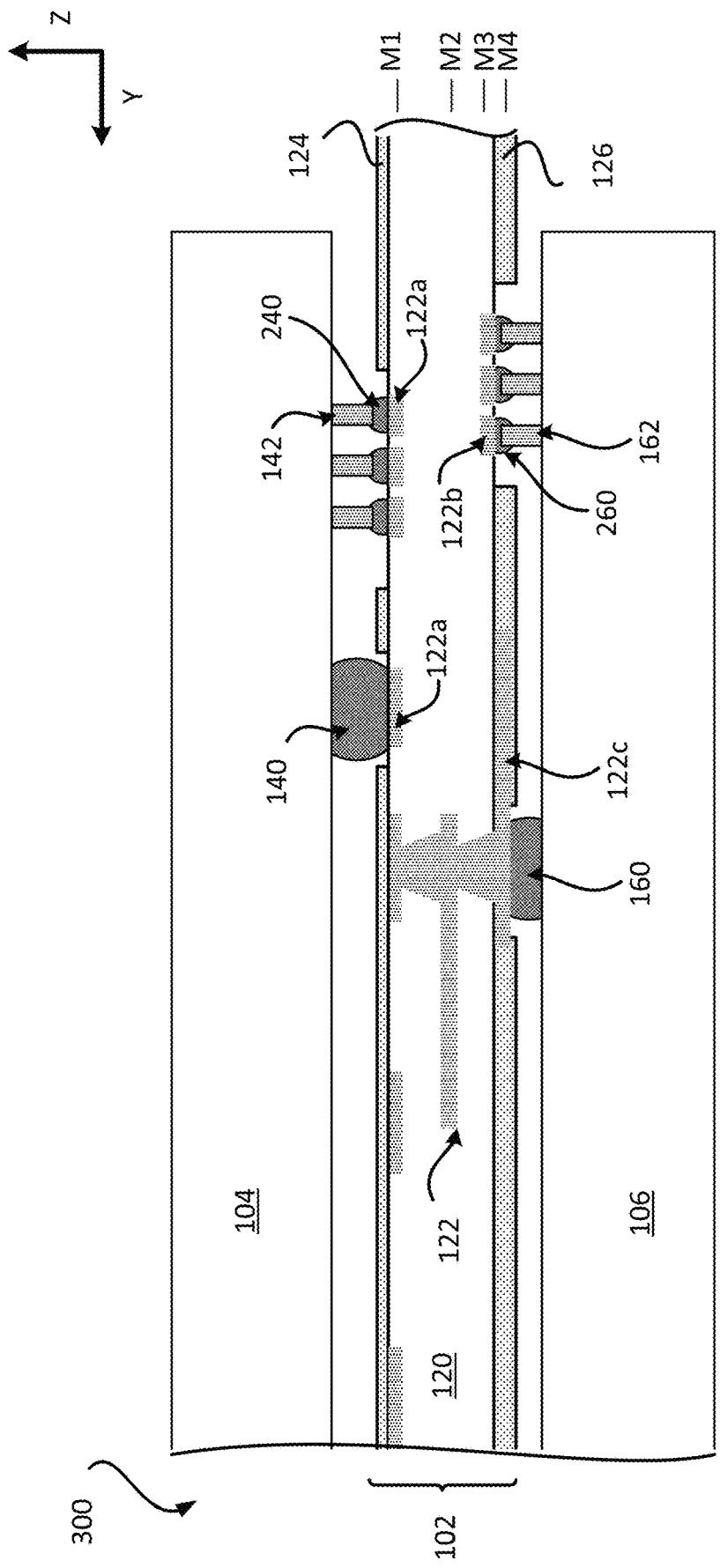
FIG. 3 illustrates a close-up view of a package that includes a substrate with high-density interconnects.

FIGS. 2 and 3 illustrate and describe in more details, various examples of high-density interconnects for a substrate.

As shown in FIG. 1, the integrated device 104 is coupled to the first surface (e.g., top surface) of the substrate 102. For example, the integrated device 104 is coupled to the plurality of interconnects 122a of the substrate 102 through the plurality of solder interconnects 140 (e.g., first plurality of solder interconnects, means for first solder interconnection) and/or the plurality of pillar interconnects 142 (e.g., first plurality of pillar interconnects, means for first pillar interconnection). The encapsulation layer 108 is coupled to the substrate 102 and the integrated device 104. The encapsulation layer 108 is located over the first surface of the substrate 102. The encapsulation layer 108 encapsulates the integrated device 104. The encapsulation layer 108 may be located over and/or around the integrated device 104. The encapsulation layer 108 may be a means for encapsulation.

The integrated device 106 is coupled to the second surface (e.g., bottom surface) of the substrate 102. For example, the integrated device 106 is coupled to the plurality of interconnects 122b of the substrate 102 through the plurality of solder interconnects 160 (e.g., second plurality of solder interconnects, means for second solder interconnection) and/or the plurality of pillar interconnects 162 (e.g., second plurality of pillar interconnects, means for second pillar interconnection).

A plurality of solder interconnects 130 may be coupled to the substrate 102. For example, the plurality of solder interconnects 130 may be coupled to the plurality of interconnects 122c. The plurality of solder interconnects 130 may be coupled to interconnects from the last meta layer (e.g., M4 layer) of the substrate 102.

FIG. 2 illustrates a close-up view of the package 100. As shown in FIG. 2, the package 100 includes the substrate 102, the integrated device 104 and the integrated device 106. The substrate 102 includes the plurality of interconnects 122. The plurality of interconnects 122 includes the plurality of interconnects 122a, the plurality of interconnects 122b, and the plurality of interconnects 122c.

The integrated device 104 is coupled to the plurality of interconnects 122a through the plurality of solder interconnects 140. The integrated device 104 is coupled to the plurality of interconnects 122a through the plurality of pillar interconnects 142 and/or the plurality of solder interconnects 240 (e.g., first plurality of solder interconnects, means for first solder interconnection). It is noted that the plurality of solder interconnects 140 and the plurality of solder interconnects 240 may be considered part of the same group of solder interconnects, even if they have different sizes and/or volume. The plurality of interconnects 122a includes a plurality of high-density interconnects. The plurality of interconnects 122a may include interconnects located on a top metal layer of the substrate 102, such as the M1 layer (e.g., first metal layer). The plurality of interconnects 122a may be located (e.g., embedded) in the at least one dielectric layer 120. The plurality of interconnects 122a may be located through a first surface of the at least one dielectric layer 120. For example, the plurality of interconnects 122a may include interconnects that are located (e.g., embedded) in the at least one dielectric layer 120 through the first surface of the at least one dielectric layer 120. At least some of the interconnects from the plurality of interconnects 122a may have an interconnect surface that is planar with the first surface (e.g., top surface) of the at least one dielectric layer 120. The plurality of interconnects 122a includes a minimum width of about 3-4 micrometers, and a minimum spacing of about 3-4 micrometers. The plurality of interconnects 122a may include at least one interconnect with a width of about 3-4 micrometers or greater. The plurality of interconnects 122a may include at least one interconnect with a spacing of about 3-4 micrometers or greater.

The integrated device 106 is coupled to the plurality of interconnects 122b through the plurality of solder interconnects 160. The integrated device 106 is coupled to the plurality of interconnects 122b through the plurality of pillar interconnects 162 and/or the plurality of solder interconnects 260 (e.g., second plurality of solder interconnects, means for second solder interconnection). It is noted that the plurality of solder interconnects 160 and the plurality of solder interconnects 260 may be considered part of the same group of solder interconnects, even if they have different sizes and/or volume. The integrated device 106 is coupled to interconnects from the M3 layer of the substrate 102. The plurality of interconnects 122*b* includes a plurality of high-density interconnects. The plurality of interconnects 122*b* may be located (e.g., embedded) in the at least one dielectric layer 120. The plurality of interconnects 122*b* may be located through a second surface of the at least one dielectric layer 120. For example, the plurality of interconnects 122*b* may include interconnects that are embedded in the at least one dielectric layer 120 through the second surface of the at least one dielectric layer 120. At least some of the interconnects from the plurality of interconnects 122*b* may have an interconnect surface that is planar with the second surface (e.g., bottom surface) of the at least one dielectric layer 120. The plurality of interconnects 122*b* may include interconnects located on the next to last metal layer (e.g., next to bottom metal layer, M3 layer) of the substrate 102. The plurality of interconnects 122*b* may include interconnects located on the last metal layer embedded in the at least one dielectric layer 120. The plurality of interconnects 122*b* includes a minimum width of about 3-4 micrometers, and a minimum spacing of about 3-4 micrometers. The plurality of interconnects 122*b* may include at least one interconnect with a width of about 3-4 micrometers or greater. The plurality of interconnects 122*b* may include at least one interconnect with a spacing of about 3-4 micrometers or greater.

In some implementations, at least some interconnects from the plurality of interconnects 122*c* may be located in the at least one dielectric layer 120. In some implementations, at least some interconnects from the plurality of interconnects 122*c* may be located over a second surface (e.g., bottom surface) of the at least one dielectric layer 120. The plurality of interconnects 122*c* may be at surrounded by the solder resist layer 126. The plurality of interconnects 122*c* may be a means for interconnection. The plurality of interconnects 122*c* may include interconnects located on the last metal layer (e.g., bottom metal layer, M4 layer) of the substrate 102. It is noted that the plurality of interconnects 122*c* may include interconnects located on other metal layers, such as the M2 layer. At least some interconnects from the plurality of interconnects 122*c* that are located over the second surface of the at least one dielectric layer 120 may have an interconnect surface that is planar with the second surface of the at least one dielectric layer 120 and/or another interconnect surface of at least one interconnect from the plurality of interconnects 122*b* that is located through the second surface of the at least one dielectric layer 120. For example, an interconnect (e.g., high-density interconnect, high-density trace interconnect, high-density pad interconnect) from the plurality of interconnects 122*b*, may have an interconnect surface that faces away from the at least one dielectric layer 120, and where the interconnect surface is planar with another interconnect surface of an interconnect (e.g., trace interconnect, pad interconnect) from the plurality of interconnects 122*c*, that faces towards the at least one dielectric layer 120, and where the interconnect (e.g., trace interconnect, pad interconnect) from the plurality of interconnects 122*c* is located over the second surface of the at least one dielectric layer 120. The plurality of interconnects 122*c* includes a minimum width of about 8 micrometers, and a minimum spacing of about 8 micrometers. The plurality of interconnects 122*c* may include at least one interconnect with a width of about 8 micrometers or greater. The plurality of interconnects 122*c* may include at least one interconnect with a spacing of about 8 micrometers or greater.

FIG. 3 illustrates a close-up view of the package 300. The package 300 is similar to the package 100, and includes components that are similar and/or configured in a similar manner as the package 100. As shown in FIG. 3, the package 300 includes the substrate 102, the integrated device 104 and the integrated device 106. The substrate 102 includes the plurality of interconnects 122. The plurality of interconnects 122 includes the plurality of interconnects 122*a*, the plurality of interconnects 122*b*, and the plurality of interconnects 122*c*.

The integrated device 106 is coupled to the plurality of interconnects 122*c* through the plurality of solder interconnects 160. The integrated device 106 is coupled to the plurality of interconnects 122*b* through the plurality of pillar interconnects 162 and/or the plurality of solder interconnects 260. The integrated device 106 is coupled to interconnects from the M3 layer and the M4 layer of the substrate 102. The plurality of interconnects 122*b* includes a plurality of high-density interconnects. The plurality of interconnects 122*b* may be embedded in the at least one dielectric layer 120. The plurality of interconnects 122*c* may be located in the at least one dielectric layer 120 and over a second surface (e.g., bottom surface) of the at least one dielectric layer 120. FIG. 3 illustrates that the integrated device 106 may be coupled interconnects in the at least one dielectric layer 120 and interconnects located over a second surface of the at least one dielectric layer 120.

FIGS. 1-3 illustrate and describe how high-density interconnects may be located on both sides and/or surfaces of a substrate. This enables high-speed communication to be provided to integrated devices located on both sides of the substrate. The high-density interconnects located on both sides and/or surfaces of the substrate may be configured to be coupled together through non high-density interconnects. For example, the plurality of interconnects 122*a* (e.g., first plurality of high-density interconnects) and the plurality of interconnects 122*b* (e.g., second plurality of high-density interconnects) may be configured to be coupled together through other interconnects (e.g., non high-density interconnects) from the plurality of interconnects 122. As will be further described, the high-density interconnects (e.g., 122*a*, 122*b*) may be fabricated using an embedded trace substrate (ETS) process. The number of metal layers shown in the substrate 102 is exemplary. Different implementations of the substrate may have different numbers of metal layers. For example, a substrate may include 7 metal layers (e.g., M1-M7 layers). In such an example, the plurality of interconnects 122*a* may include interconnects located on the M1 metal layer (e.g., first metal layer), the plurality of interconnects 122*b* may include interconnects located on the M6 metal layer (e.g., next to last metal layer, next to bottom metal layer), and the plurality of interconnects 122*c* may include interconnects on the M7 metal layer (e.g., last metal layer, bottom metal layer). It is noted that the numbering of the metal layers goes from top to bottom of the substrate. However, the numbering of the metal layers may go from bottom to top of the substrate. Trace interconnects and/or pad interconnects may be located on one or more metal layers of a substrate. Via interconnects may be located between metal layers of a substrate. It is noted that a bottom surface and/or a top surface as described in the disclosure may be arbitrarily defined. In some implementations, a first surface may be a bottom surface and a second surface may be a top surface. In some implementations, a second surface may be a bottom surface and a first surface may be a top surface.

FIGS. 2 and 3 illustrate that the vertical spacing between interconnects from the M3 layer and interconnects from the M4 layer is smaller (e.g., closer) than the vertical spacing between interconnects from the M3 layer and interconnects from the M2 layer. This configuration may help provide a thinner substrate than other substrates with the same number of metal layers. It is noted that the width, spacing, minimum width and/or minimum spacing that are mentioned for the various interconnects are exemplary. In some implementations, the width, spacing, minimum width and/or minimum spacing of interconnects may vary. In some implementations, different combinations of the width, spacing, minimum width and/or minimum spacing for interconnects may be used for a substrate. Whichever combinations of the width, spacing, minimum width and/or minimum spacing for interconnects that is used may be dependent on the design and/or requirements of the package that includes integrated device(s) and a substrate. For example, in some implementations, the substrate 102 may include (i) the plurality of interconnects 122a and/or the plurality of interconnects 122b, with interconnects comprising a minimum width of about 6 micrometers and/or a minimum spacing of about 8 micrometers, and (ii) the plurality of interconnects 122c with interconnects with a minimum width of about 10 micrometers and/or a minimum spacing of about 15 micrometers. In some implementations, the substrate 102 may include (i) the plurality of interconnects 122a and/or the plurality of interconnects 122b, with interconnects comprising a width of about 6 micrometers or greater and/or a spacing of about 8 micrometers or greater, and (ii) the plurality of interconnects 122c with interconnects comprising a width of about 10 micrometers or greater and/or a minimum spacing of about 15 micrometers or greater.

As used in the disclosure, the high-density interconnects may be interconnects that have minimum width and/or minimum spacing that is less than other interconnects of a substrate. As used in the disclosure, high-density interconnects may be interconnects that have a width and/or a spacing that is less than other interconnects of a substrate. In some implementations, the high-density interconnects of a substrate may be a first plurality of interconnects of the substrate, and other interconnects (e.g., non high-density interconnects) of the substrate may be a second plurality of interconnects and/or a third plurality of interconnects of the substrate. In some implementations, high-density interconnects of a substrate may be similar to interconnects (e.g., non high-density interconnects) of a substrate, except that the high-density interconnects have improved width and/or spacing, which allows for higher density routing in a substrate. A plurality of interconnects that includes a particular width and/or a particular spacing may mean that one or more of the interconnects from the plurality of interconnects, each includes a particular width and/or a particular spacing. A plurality of interconnects that includes a particular minimum width and/or a particular minimum spacing may mean that one or more of the interconnects from the plurality of interconnects, each includes a particular minimum width and/or a particular minimum spacing.

An integrated device (e.g., 104, 106) may include a die (e.g., semiconductor bare die). An integrated device may include integrated circuits. The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104, 106) may include at least one electronic circuit (e.g., first electronic circuit, second electronic circuit, etc. . . . ). An integrated device may be an example of an electrical component and/or electrical device.

The package (e.g., 100, 300) may be implemented in a radio frequency (RF) package. The RF package may be a radio frequency front end package (RFFE). A package (e.g., 100, 300) may be configured to provide Wireless Fidelity (WiFi) communication and/or cellular communication (e.g., 2G, 3G, 4G, 5G). The packages (e.g., 100, 300) may be configured to support Global System for Mobile Communications (GSM), Universal Mobile Telecommunications System (UMTS), and/or Long-Term Evolution (LTE). The packages (e.g., 100, 300) may be configured to transmit and receive signals having different frequencies and/or communication protocols.

Having described various packages with a substrate, several methods for fabricating a substrate will now be described below.

Exemplary Sequence for Fabricating a Substrate

Figure 4A:
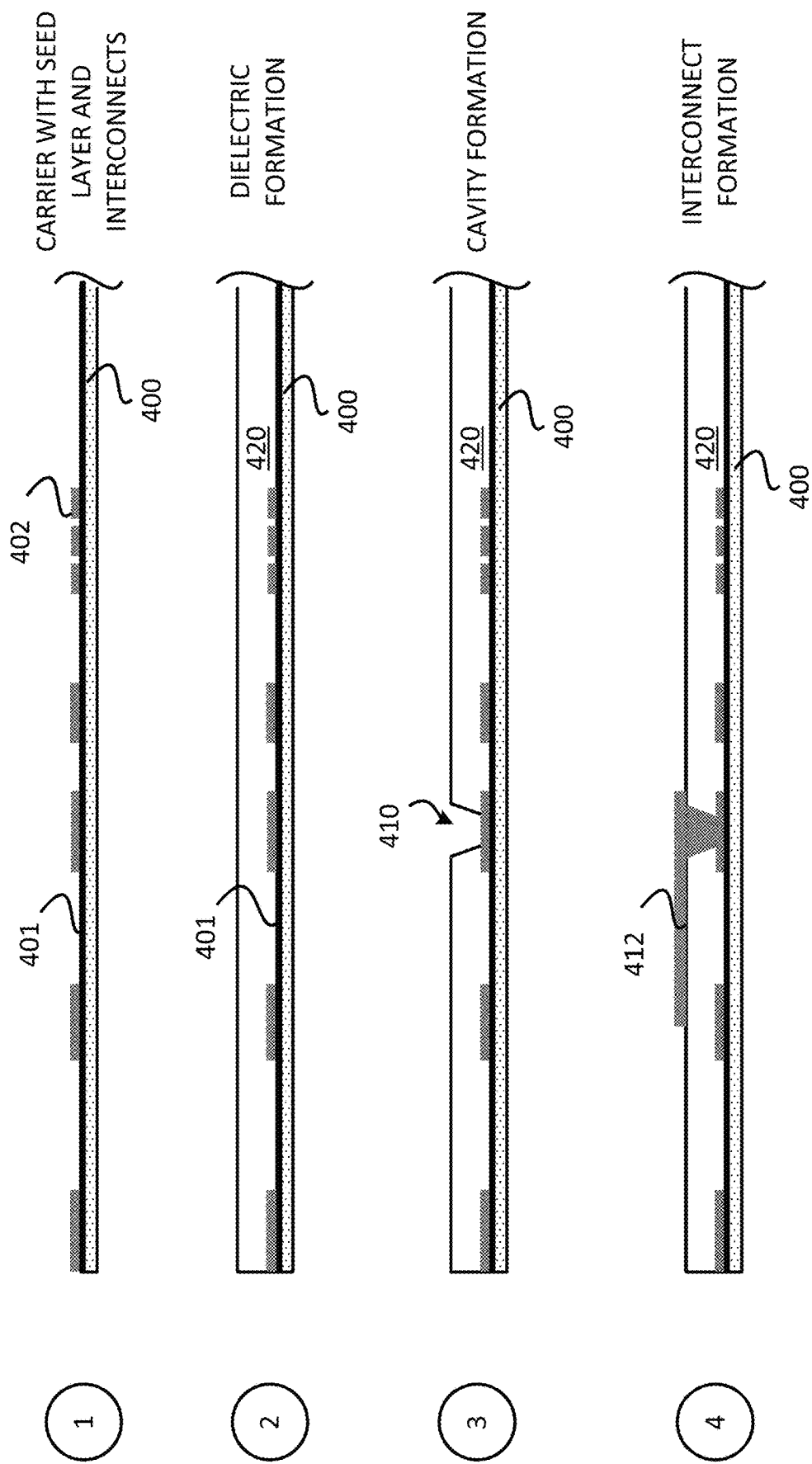
FIGS. 4A-4C illustrate an exemplary sequence for fabricating a substrate with high-density interconnects.
Figure 4B:
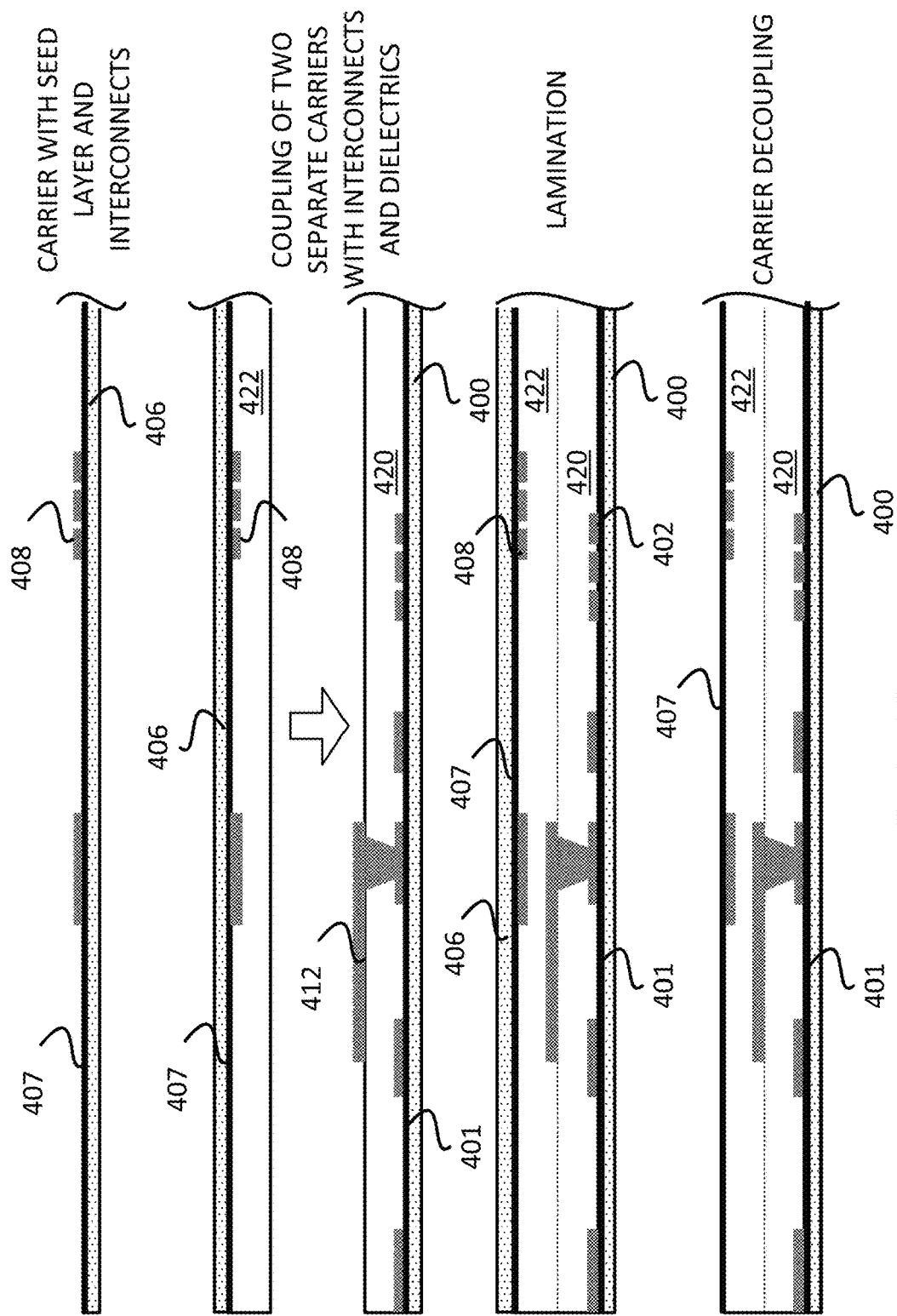
Figure 4C:
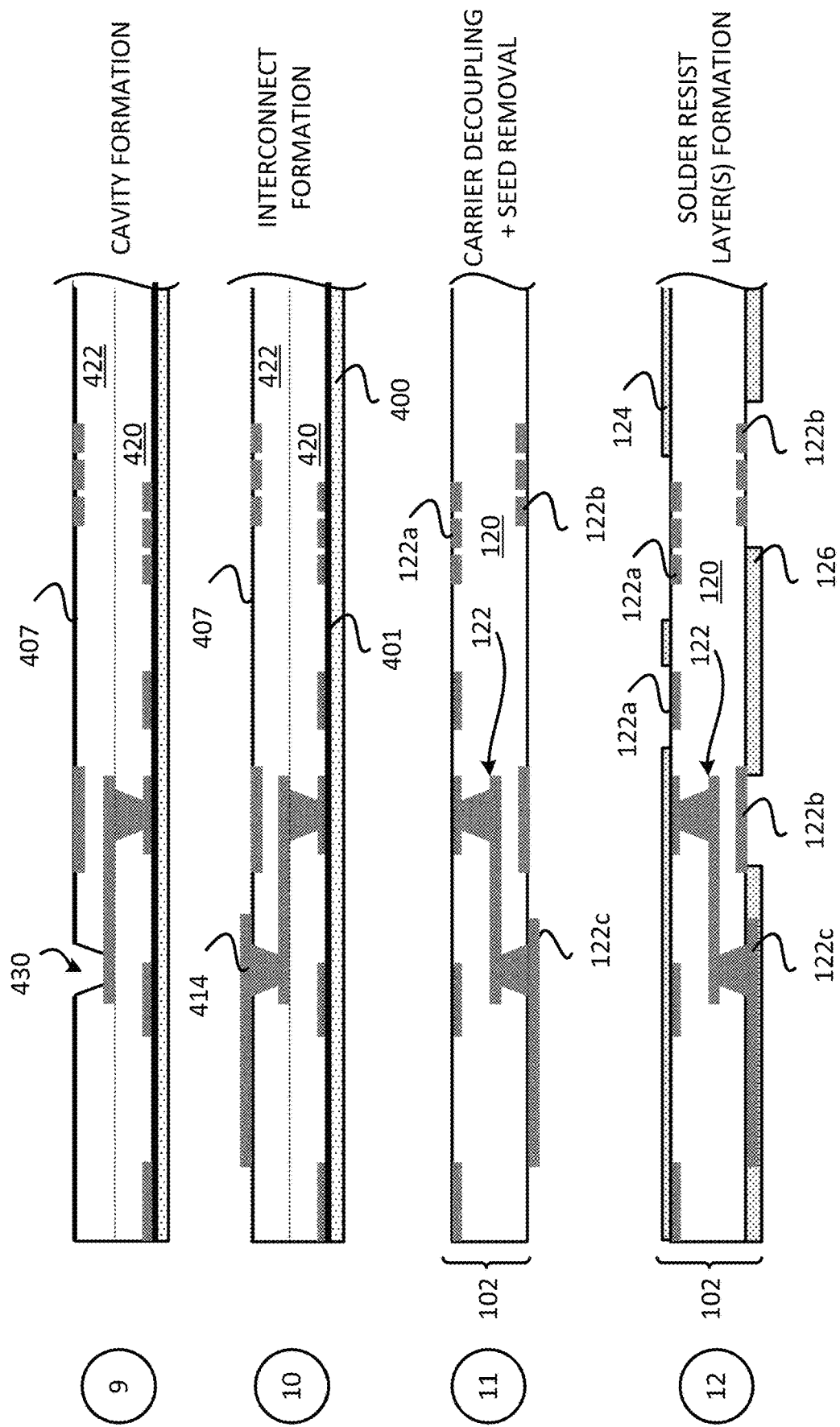

In some implementations, fabricating a substrate includes several processes. FIGS. 4A-4C illustrate an exemplary sequence for providing or fabricating a substrate. FIGS. 4A-4C may be used for providing or fabricating a coreless substrate. In some implementations, the sequence of FIGS. 4A-4C may be used to provide or fabricate the substrate 102. However, the process of FIGS. 4A-4C may be used to fabricate any of the substrates described in the disclosure.

It should be noted that the sequence of FIGS. 4A-4C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 4A, illustrates a state after a first carrier 400 is provided. A first seed layer 401 and interconnects 402 may be located over the first carrier 400. The interconnects 402 may be located over the first seed layer 401. A plating process and etching process may be used to form the interconnects 402. In some implementations, the first carrier 400 may be provided with the first seed layer 401 and a metal layer that is patterned to form the interconnects 402. The interconnects 402 may include high-density interconnects. For example, the interconnects 402 may represent at least some of the high-density interconnects from the plurality of interconnects 122a.

Stage 2 illustrates a state after a dielectric layer 420 is formed over the first carrier 400, the first seed layer 401 and the interconnects 402. A deposition and/or lamination process may be used to form the dielectric layer 420. The dielectric layer 420 may include polyimide. However, different implementations may use different materials for the dielectric layer.

Stage 3 illustrates a state after a plurality of cavities 410 is formed in the dielectric layer 420. The plurality of cavities 410 may be formed using an etching process (e.g., photo etching process) or laser process.

Stage 4 illustrates a state after interconnects 412 are formed in and over the dielectric layer 420, including in and over the plurality of cavities 410. For example, a via, pad and/or traces may be formed. A plating process may be used to form the interconnects. It is noted that Stages 2 through 4 may be iteratively repeated to form addition dielectric layers and additional interconnects.

Stage 5, as shown in FIG. 4B, illustrates a state after a second carrier 406 is provided. A second seed layer 407 and interconnects 408 may be located over the second carrier 406. The interconnects 408 may be located over the second seed layer 407. A plating process and etching process may be used to form the interconnects 408. In some implementations, the second carrier 406 may be provided with the second seed layer 407 and a metal layer that is patterned to form the interconnects 408. The interconnects 408 may include high-density interconnects. For example, the interconnects 408 may represent at least some of the high-density interconnects from the plurality of interconnects 122b.

Stage 6 illustrates a process of coupling the second carrier 406, the second seed layer 407, the interconnects 408, and a dielectric layer 422 to the dielectric layer 420 and the interconnects 412. The dielectric layer 422 may include prepreg.

Stage 7 illustrates a state after the second carrier 406, the second seed layer 407, the interconnects 408, and the dielectric layer 422 have been coupled to the dielectric layer 420, the interconnects 412, the interconnects 402, the first seed layer 401, and the first carrier 400. A lamination process may be used to couple the second carrier 406, the second seed layer 407, the interconnects 408, and the dielectric layer 422 to the dielectric layer 420, the interconnects 412, the interconnects 402, the first seed layer 401, and the first carrier 400.

Stage 8 illustrates a state after the second carrier 406 is decoupled (e.g., detached, removed) from the second seed layer 407.

Stage 9, as shown in FIG. 4C, illustrates a state after a plurality of cavities 430 is formed in the dielectric layer 422. An etching process or laser process may be used to form the cavities 430.

Stage 10 illustrates a state after interconnects 414 are formed in and over the dielectric layer 422, including in and over the plurality of cavities 430. For example, via, pad and/or trace may be formed. A plating process may be used to form the interconnects.

Some or all of the interconnects 402, 408, 412, and/or 414 may define a plurality of interconnects 122 of the substrate 102. For example, the interconnects 402 may be represented by the plurality of interconnects 122a, the interconnects 408 may be represented by the plurality of interconnects 122b, and the interconnects 412 and 414 may be represented by the plurality of interconnects 122c. The dielectric layers 420 and 422 may be represented by the at least one dielectric layer 120. The dielectric layers 420 and/or 422 may include prepreg. In some implementations, the dielectric layer 420 may include Ajinomoto build-up film (ABF) and/or polyimide. In some implementations, the at least one dielectric layer 120 may include at least one layer of prepreg and at least one layer of ABF. In some implementations, the at least one dielectric layer 120 may include at least one layer of prepreg and at least one layer of polyimide.

Stage 11 illustrates a state after the first carrier 400 is decoupled (e.g., detached, removed, grinded out) from the at least one dielectric layer 120 and first seed layer 401, portions of the first seed layer 401 are removed (e.g., etched out), and portions of the second seed layer 407 are removed (e.g., etched out), leaving the substrate 102 that includes the at least one dielectric layer 120 and the plurality of interconnects 122. The plurality of interconnects 122 includes the plurality of interconnects 122a, the plurality of interconnects 122b and the plurality of interconnects 122c. The substrate 102 may be a coreless substrate.

Stage 12 illustrates a state after the solder resist layer 124 and the solder resist layer 126 are formed over the substrate 102. A deposition process may be used to form the solder resist layer 124 and the solder resist layer 126. In some implementations, none or one solder resist layer may be formed over the at least one dielectric layer 120.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 5:
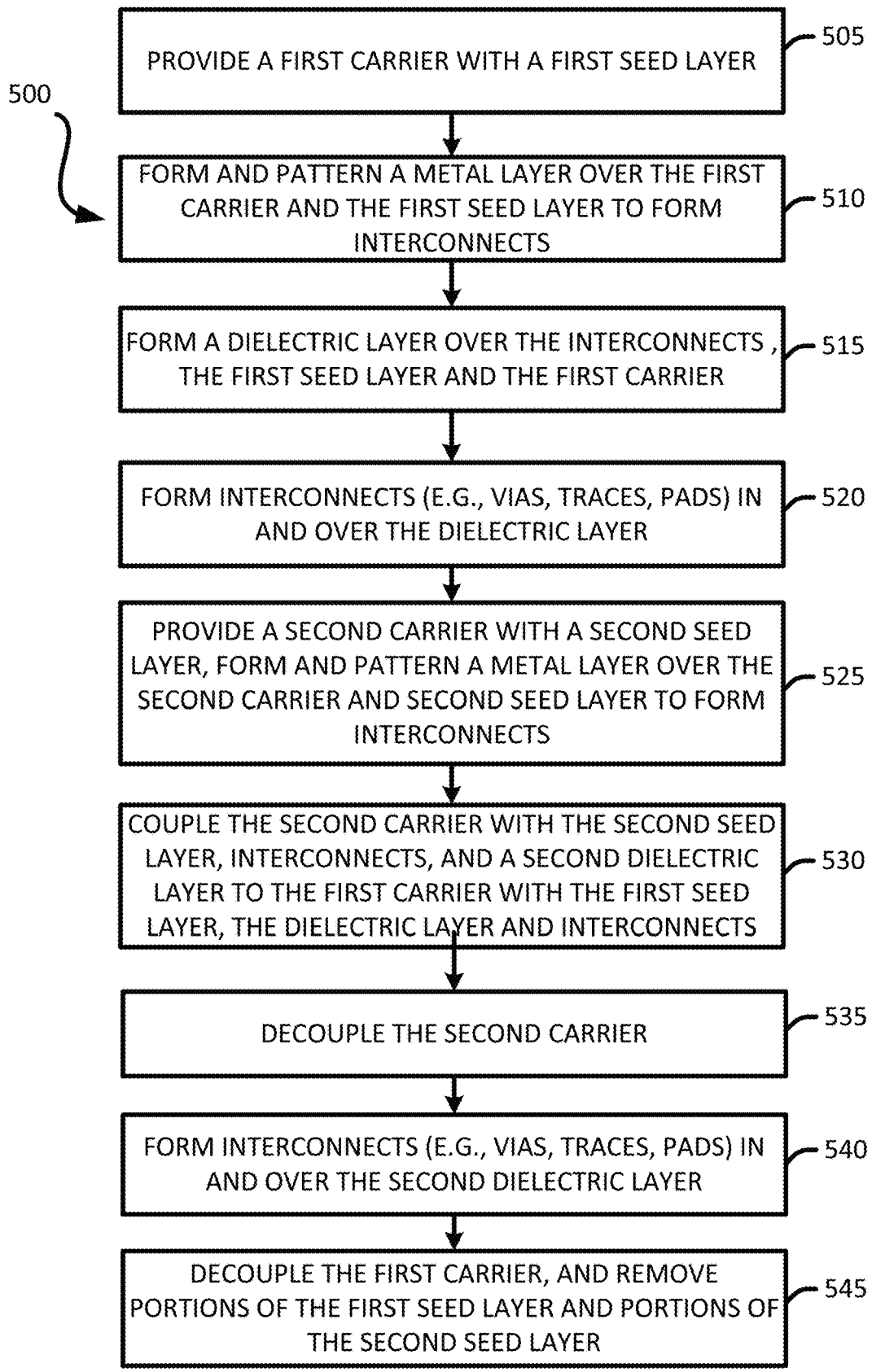
FIG. 5 illustrates an exemplary sequence for fabricating a substrate with high-density interconnects.

In some implementations, fabricating a substrate includes several processes. FIG. 5 illustrates an exemplary flow diagram of a method 500 for providing or fabricating a substrate. In some implementations, the method 500 of FIG. 5 may be used to provide or fabricate the substrate(s) of FIGS. 1-3. For example, the method of FIG. 5 may be used to fabricate the substrate 102.

It should be noted that the method 500 of FIG. 5 may combine one or more processes in order to simplify and/or clarify the method for providing or fabricating a substrate. In some implementations, the order of the processes may be changed or modified.

The method provides (at 505) a first carrier (e.g., 400). Different implementations may use different materials for the first carrier 400. The first carrier 400 may include a first seed layer (e.g., 401). The first seed layer 401 may include a metal (e.g., copper). The first carrier may include a substrate, glass, quartz and/or carrier tape. Stage 1 of FIG. 4A illustrates and describes an example of a first carrier with a first seed layer that is provided.

The method forms and patterns (at 510) interconnects over the first carrier 400 and the first seed layer 401. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 402). Stage 1 of FIG. 4A illustrates and describes an example of interconnects over a seed layer and a carrier.

The method forms (at 515) a dielectric layer 420 over the first seed layer 401, the first carrier 400 and the interconnects 402. A deposition and/or lamination process may be used to form the dielectric layer 420. The dielectric layer 420 may include polyimide. Forming the dielectric layer may also include forming a plurality of cavities (e.g., 410) in the dielectric layer 420. The plurality of cavities may be formed using an etching process (e.g., photo etching) or laser process. Stages 2-3 of FIG. 4A illustrate and describe an example of forming a dielectric layer and cavities in the dielectric layer.

The method forms (at 520) interconnects in and over the dielectric layer. For example, the interconnects 412 may be formed in and over the dielectric layer 420. A plating process may be used to form the interconnects. Forming interconnects may include providing a patterned metal layer over and/or in the dielectric layer. Forming interconnects may also include forming interconnects in cavities of the dielectric layer. Stage 4 of FIG. 4A illustrates and describes an example of forming interconnects in and over a dielectric layer. It is noted that some methods may iteratively provide and/or form additional interconnects and additional dielectric layers as described at 515 and at 520.

The method provides (at 525) a second carrier (e.g., 406). Different implementations may use different materials for the second carrier 406. The second carrier may include a second seed layer (e.g., 407). The second seed layer 407 may include a metal (e.g., copper). The second carrier may include a substrate, glass, quartz and/or carrier tape. The method may also form and pattern (at 525) interconnects 408 over the second carrier 406 and the second seed layer 407. A metal layer may be patterned to form interconnects. A plating process may be used to form the metal layer and interconnects. Stage 5 of FIG. 4B illustrates and describes an example of a second carrier with a second seed layer and interconnects.

The method couples (at 530) the second carrier 406, the second seed layer 407, the interconnects 408, a dielectric layer 422 to the first carrier 400, the first seed layer 401, the interconnects 402, and the dielectric layer 420. A lamination process may be used to couple the second carrier 406, the second seed layer 407, the interconnects 408, a dielectric layer 422 to the first carrier 400, the first seed layer 401, the interconnects 402, and the dielectric layer 420. Stages 6-7 of FIG. 4B illustrate and describe an example of coupling interconnects from one carrier to interconnects from another carrier.

The method decouples (at 535) the second carrier (e.g., 406) from the second seed layer (e.g., 407). The second carrier 406 may be detached and/or grounded out. Stage 8 of FIG. 4B illustrates and describes an example of carrier decoupling.

The method forms (at 540) interconnects in and/or over the dielectric layer. For example, the interconnects 414 may be formed in and/or over the dielectric layer 422. A plating process may be used to form the interconnects. Forming interconnects may include providing a patterned metal layer over an in the dielectric layer. Forming interconnects may also include forming interconnects in cavities of the dielectric layer. Stages 9-10 of FIG. 4C illustrate and describe an example of forming interconnects in and over a dielectric layer.

The method decouples (at 545) the first carrier (e.g., 400) from the first seed layer (e.g., 401). The first carrier 400 may be detached and/or grounded out. The method may also remove (at 545) portions of the first seed layer (e.g., 401) and portions of the second seed layer (e.g., 407). An etching process may be used to remove portions of the first seed layer 401 and portions of the second seed layer 407. Stage 11 of FIG. 4C illustrates and describes an example of decoupling a carrier and seed layer removal.

In some implementations, after the carrier(s) and seed layer(s) removal, the method may form solder resist layers (e.g., 124, 126) over the substrate. Stage 12 of FIG. 4C illustrates and describes an example of forming solder resist layers.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 6A:
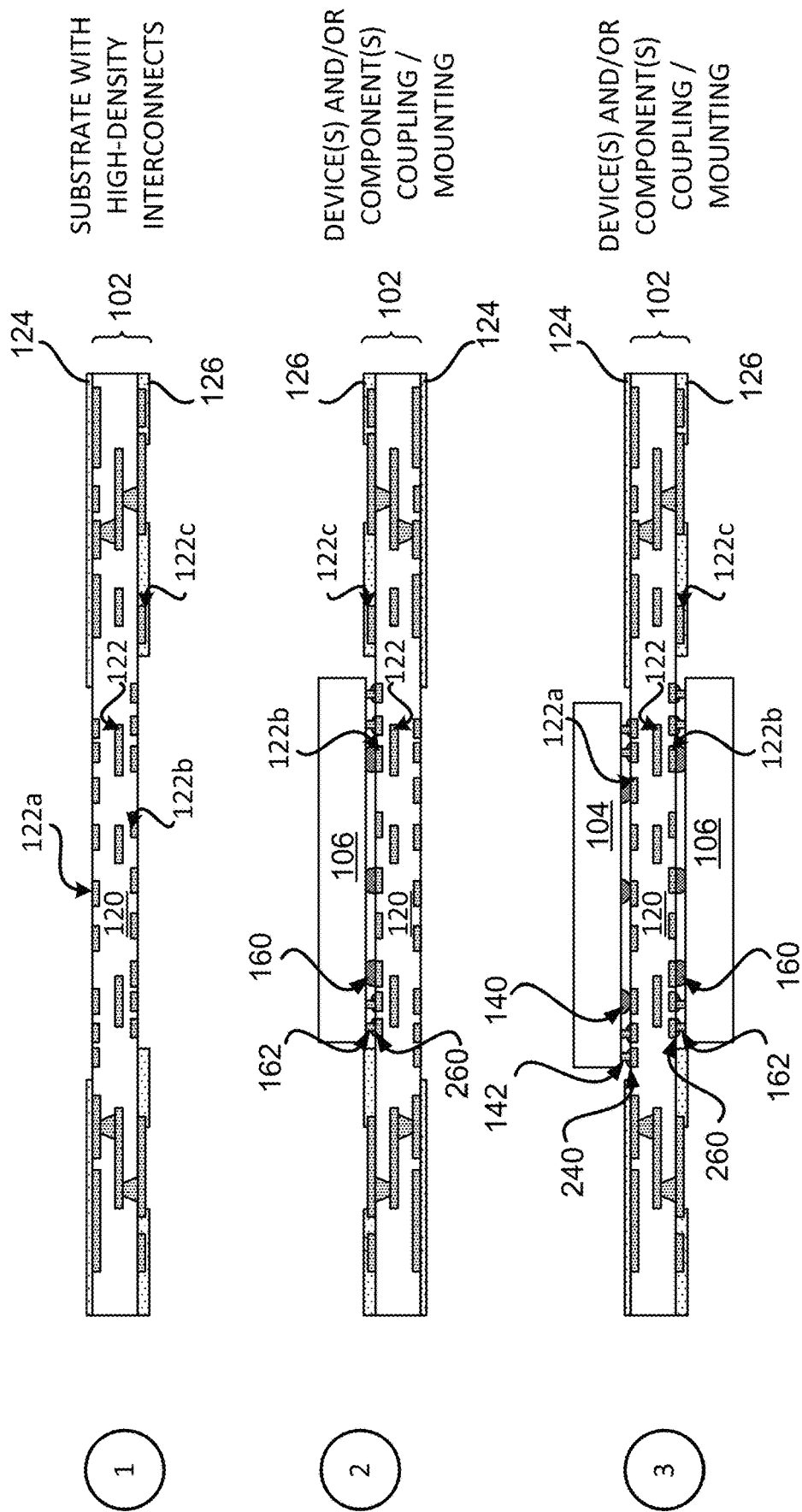
FIGS. 6A-6B illustrate an exemplary sequence for fabricating a package comprising a substrate with high-density interconnects.
Figure 6B:
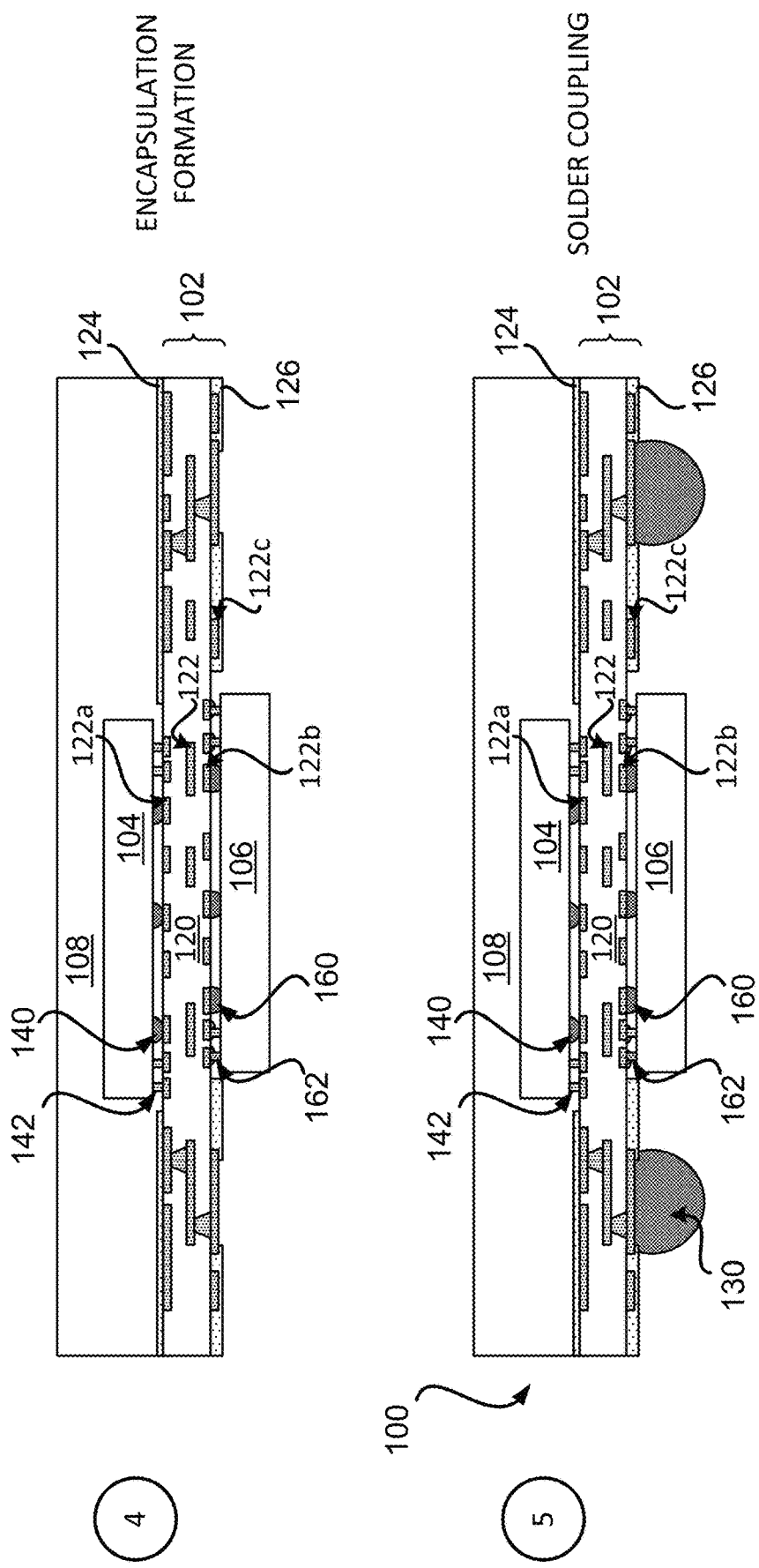

Exemplary Sequence for Fabricating a Package Comprising a Substrate with High-Density Interconnects In some implementations, fabricating a package includes several processes. FIGS. 6A-6B illustrate an exemplary sequence for providing or fabricating a package that includes a substrate with high-density interconnects. In some implementations, the sequence of FIGS. 6A-6B may be used to provide or fabricate the package 100. However, the process of FIGS. 6A-6B may be used to fabricate any of the packages (e.g., 300) described in the disclosure.

It should be noted that the sequence of FIGS. 6A-6B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 6A illustrates a state after a substrate 102 is provided. The substrate 102 includes at least one dielectric layer 120, a plurality of interconnects 122, a solder resist layer 124, and a solder resist layer 126. The plurality of interconnects 122 may include the plurality of interconnects 122a, the plurality of interconnects 122b and the plurality of interconnects 122c. Some of the interconnects may include high-density interconnects. For example, a first plurality of high-density interconnects may be located on a first side of the substrate, and a second plurality of high-density interconnects may be located on a second side of the substrate, as described in FIGS. 1-3. Different implementations may use different substrates with different numbers of metal layers. The substrate 102 may be fabricated using the method as described in FIGS. 4A-4C.

Stage 2 illustrates a state after the integrated device 106 is coupled to the substrate 102 through the plurality of solder interconnects 160, the plurality of pillar interconnects 162, and/or the plurality of solder interconnects 260. A solder reflow process may be used to couple the integrated device 106 to the substrate 102. The integrated device 106 may be coupled to the second surface (e.g., bottom surface) of the substrate 102. FIG. 2 illustrates an example of how the integrated device 106 may be coupled to the substrate 102. Different implementations may couple different components and/or devices to the substrate 102.

Stage 3 illustrates a state after the integrated device 104 is coupled to the substrate 102 through the plurality of solder interconnects 140, the plurality of pillar interconnects 142, and/or the plurality of solder interconnects 240. A solder reflow process may be used to couple the integrated device 104 to the substrate 102. The integrated device 104 may be coupled to the first surface (e.g., top surface) of the substrate 102. FIG. 2 illustrates an example of how the integrated device 104 may be coupled to the substrate 102. Different implementations may couple different components and/or devices to the substrate 102.

Stage 4, as shown in FIG. 6B, illustrates a state after an encapsulation layer 108 is provided (e.g., formed) over the first surface of the substrate 102. The encapsulation layer 108 may encapsulate the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 5 illustrates a state after a plurality of solder interconnects 130 is coupled to the substrate 102. A solder reflow process may be used to couple the plurality of solder interconnects 130 to the substrate 102. The plurality of solder interconnects 130 may be coupled to the plurality of interconnects 122.

The packages (e.g., 100, 300) described in the disclosure may be fabricated one at a time or may be fabricated together as part of one or more wafers and then singulated into individual packages.

Figure 7:
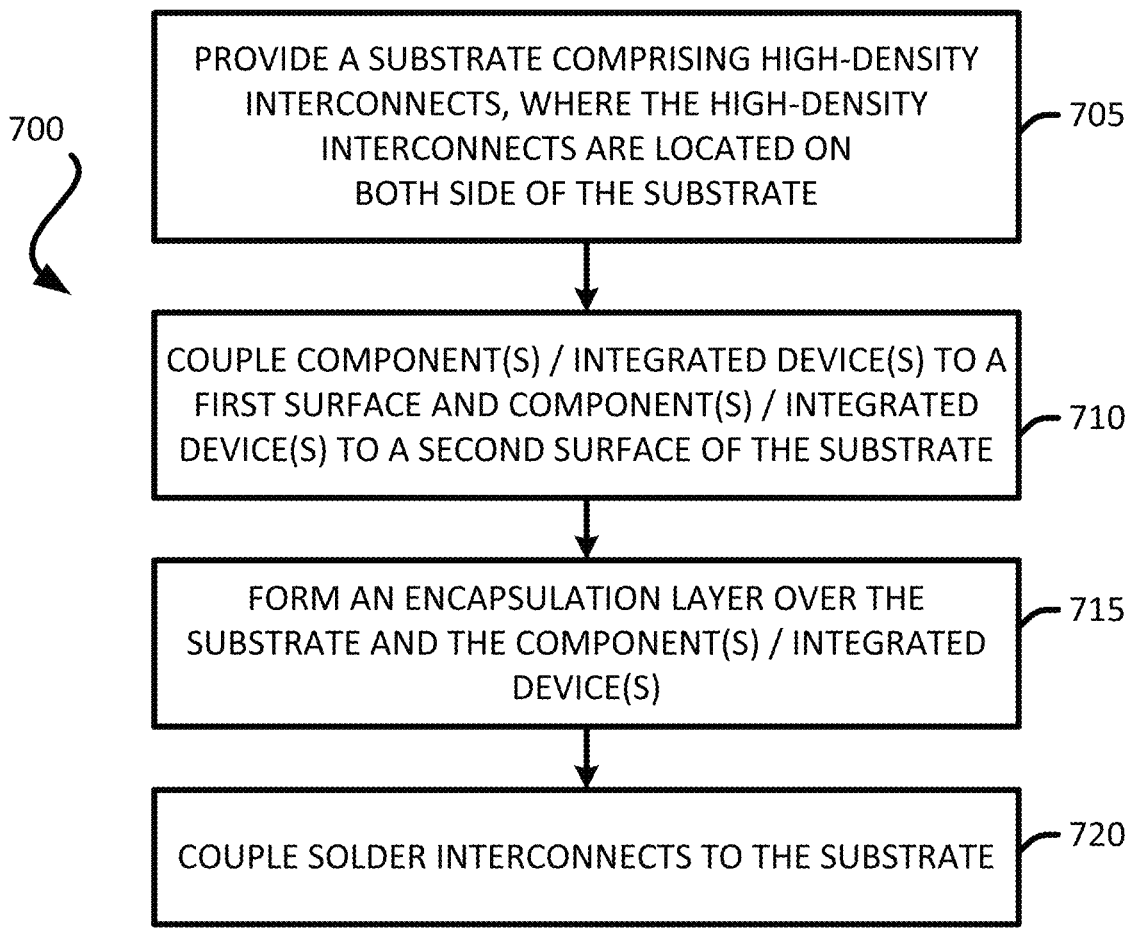
FIG. 7 illustrates an exemplary sequence for fabricating a package comprising a substrate with high-density interconnects.

Exemplary Flow Diagram of a Method for Fabricating a Package Comprising a Substrate with High-Density Interconnects In some implementations, fabricating a package includes several processes. FIG. 7 illustrates an exemplary flow diagram of a method 700 for providing or fabricating a package comprising a substrate with high-density interconnects. In some implementations, the method 700 of FIG. 7 may be used to provide or fabricate the package 100 described in the disclosure. However, the method 700 may be used to provide or fabricate any of the packages (e.g., 300) described in the disclosure.

It should be noted that the method of FIG. 7 may combine one or more processes in order to simplify and/or clarify the method for providing or fabricating a package. In some implementations, the order of the processes may be changed or modified.

The method provides (at 705) a substrate (e.g., 102). The substrate 102 may be provided by a supplier or fabricated. The substrate 102 includes at least one dielectric layer 120, a plurality of interconnects 122, a solder resist layer 124, and a solder resist layer 126. The plurality of interconnects 122 may include the plurality of interconnects 122a, the plurality of interconnects 122b and the plurality of interconnects 122c. Some of the interconnects may include high-density interconnects. For example, a first plurality of high-density interconnects may be located on a first side of the substrate, and a second plurality of high-density interconnects may be located on a second side of the substrate, as described in FIGS. 1-3. Different implementations may use different processes to fabricate the substrate 102. FIGS. 4A-4C illustrate and describe an example of fabricating a substrate with high-density interconnects. Stage 1 of FIG. 6A illustrates and describes an example of providing a substrate with high-density interconnects.

The method couples (at 710) an integrated device (e.g., 106) to the substrate 102. For example, the integrated device 106 is coupled to a second surface (e.g., bottom surface) of the substrate 102. The integrated device 106 is coupled to the substrate 102 through the plurality of solder interconnects 160, the plurality of pillar interconnects 162 and/or the plurality of solder interconnects 260. A solder reflow process may be used to couple the integrated device 106 to the substrate 102. Stage 2 of FIG. 6A illustrates and describes an example of coupling an integrated device to a substrate.

The method couples (at 710) an integrated device (e.g., 104) to the substrate 102. For example, the integrated device 104 is coupled to a first surface (e.g., top surface) of the substrate 102. The integrated device 104 is coupled to the substrate 102 through the plurality of solder interconnects 140, the plurality of pillar interconnects 142 and/or the plurality of solder interconnects 240. A solder reflow process may be used to couple the integrated device 104 to the substrate 102. Stage 3 of FIG. 6A illustrates and describes an example of coupling an integrated device to a substrate.

The method forms (at 715) an encapsulation layer (e.g., 108) over the first surface of the substrate (e.g., 102). The encapsulation layer 108 may be provided and formed over and/or around the substrate 102 and the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation. Stage 4 of FIG. 6B illustrates and describes an example of forming an encapsulation layer.

The method couples (at 720) a plurality of solder interconnects (e.g., 130) to the substrate 102. A solder reflow process may be used to couple the plurality of solder interconnects 130 to the substrate 102. Stage 5 of FIG. 6B, illustrates and describes an example of coupling solder interconnects to a substrate.

The packages (e.g., 100, 300) described in the disclosure may be fabricated one at a time or may be fabricated together as part of one or more wafers and then singulated into individual packages.

Exemplary Electronic Devices

Figure 8:
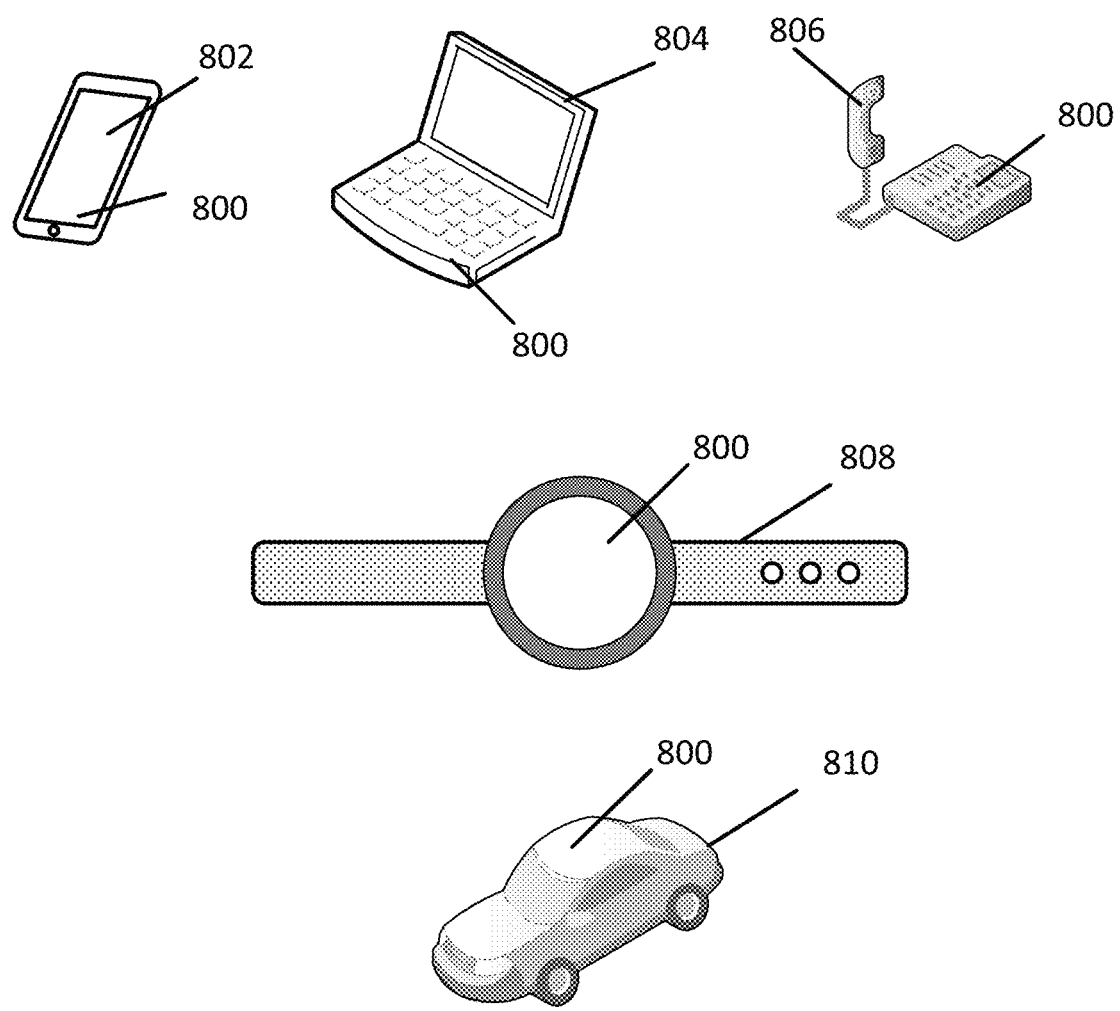
FIG. 8 illustrates various electronic devices that may integrate a die, an electronic circuit, an integrated device, an integrated passive device (IPD), a passive component, a package, and/or a device package described herein.

FIG. 8 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 802, a laptop computer device 804, a fixed location terminal device 806, a wearable device 808, or automotive vehicle 810 may include a device 800 as described herein. The device 800 may be, for example, any of the devices and/or integrated circuit (IC) packages described herein. The devices 802, 804, 806 and 808 and the vehicle 810 illustrated in FIG. 8 are merely exemplary. Other electronic devices may also feature the device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-3, 4A-4C, 5, 6A-6B, and/or 7-8 may be rearranged and/or combined into a single component, process, feature or function or embodied in several components, processes, or functions. Additional elements, components, processes, and/or functions may also be added without departing from the disclosure. It should also be noted FIGS. 1-3, 4A-4C, 5, 6A-6B, and/or 7-8 and its corresponding description in the present disclosure is not limited to dies and/or ICs. In some implementations, FIGS. 1-3, 4A-4C, 5, 6A-6B, and/or 7-8 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. There may or may not be one or more interfaces between interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects. The process of forming one or more interconnects may include desmearing, masking, mask removal, and/or etching.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate, a first integrated device coupled to a first surface of the substrate and a second integrated device coupled to a second surface of the substrate. The substrate comprising at least one dielectric layer; a first plurality of interconnects located in the at least one dielectric layer and through the first surface of the at least one dielectric layer; and a second plurality of interconnects located in the at least one dielectric layer and through the second surface of the at least one dielectric layer. The first plurality of interconnects includes a first width and a first spacing. The second plurality of interconnects includes a second width and a second spacing. The substrate includes a third plurality of interconnects located in the at least one dielectric layer. The third plurality of interconnects includes a third width that is greater than the first width and the second width. The third plurality of interconnects includes a third spacing that is greater than the first spacing and the second spacing.

Aspect 2: The package of aspect 1, wherein the first integrated device is coupled to the first plurality of interconnects, and wherein the second integrated device is coupled to the second plurality of interconnects.

Aspect 3: The package of aspects 1 through 2, wherein the first plurality of interconnects is located on a first metal layer of the substrate, and wherein the second plurality of interconnects is located on a next to last metal layer of the substrate.

Aspect 4: The package of aspects 1 through 2, wherein the first plurality of interconnects is located on a first metal layer in the at least one dielectric layer, and wherein the second plurality of interconnects is located on a last metal layer embedded in the at least one dielectric layer.

Aspect 5: The package of aspects 1 through 4, wherein the substrate includes a fourth plurality of interconnects located over the first surface of the at least one dielectric layer. In some implementations, a high-density interconnect from the plurality of interconnects, may have an interconnect surface that faces away from the at least one dielectric layer, where the interconnect surface is planar with another interconnect surface of an interconnect from the plurality of interconnects that faces towards the at least one dielectric layer, and where the interconnect is located over the first surface of the at least one dielectric layer.

Aspect 6: The package of aspects 1 through 4, wherein the substrate includes a fourth plurality of interconnects located over the second surface of the at least one dielectric layer. In some implementations, a high-density interconnect from the plurality of interconnects, may have an interconnect surface that faces away from the at least one dielectric layer, where the interconnect surface is planar with another interconnect surface of an interconnect from the plurality of interconnects that faces towards the at least one dielectric layer, and where the interconnect is located over the second surface of the at least one dielectric layer.

Aspect 7: The package of aspects 1 through 6, wherein the first plurality of interconnects includes a first minimum width of about 3-4 micrometers and/or a first minimum spacing of about 3-4 micrometers, and wherein the second plurality of interconnects includes a second minimum width of about 3-4 micrometers and/or a second minimum spacing of about 3-4 micrometers.

Aspect 8: The package of aspects 1 through 7, wherein the first width is about 3-4 micrometers or greater and/or the first spacing is about 3-4 micrometers or greater, and wherein the second width is about 3-4 micrometers or greater and/or the second spacing is about 3-4 micrometers or greater.

Aspect 9: The package of aspects 1 through 8, wherein the first integrated device is coupled to the first plurality of interconnects through a first plurality of solder interconnects and/or a first plurality of pillar interconnects.

Aspect 10: The package of aspect 9, wherein the second integrated device is coupled to the second plurality of interconnects through a second plurality of solder interconnects and/or a second plurality of pillar interconnects.

Aspect 11: An apparatus comprising a substrate, a first integrated device coupled to the first surface of the substrate, and a second integrated device coupled to the second surface of the substrate. The substrate includes at least one dielectric layer; means for first high-density interconnection located in the at least one dielectric layer and through a first surface of the at least one dielectric layer; and means for second high-density interconnection located in the at least one dielectric layer and through a second surface of the at least one dielectric layer.

Aspect 12: The apparatus of aspect 11, wherein the first integrated device is coupled to the means for first high-density interconnection, and wherein the second integrated device is coupled to the means for second high-density interconnection.

Aspect 13: The apparatus of aspects 11 through 12, wherein the means for first high-density interconnection is located on a first metal layer of the substrate, and wherein the means for second high-density interconnection is located on a next to last metal layer of the substrate.

Aspect 14: The apparatus of aspects 11 through 12, wherein the means for first high-density interconnection is located on a first metal layer in the at least one dielectric layer, and wherein the means for second high-density interconnection is located on a last metal layer embedded in the at least one dielectric layer.

Aspect 15: The apparatus of aspects 11 through 14, wherein the substrate includes means for interconnection located over the first surface of the at least one dielectric layer.

Aspect 16: The apparatus of aspects 11 through 14, wherein the substrate includes means for interconnection located over the second surface of the at least one dielectric layer.

Aspect 17: The apparatus of aspects 11 through 16, wherein the means for first high-density interconnections includes interconnects with a first minimum width of about 3-4 micrometers and/or a first minimum spacing of about 3-4 micrometers, and wherein the means for second high-density interconnection includes interconnects with a second minimum width of about 3-4 micrometers and/or a second minimum spacing of about 3-4 micrometers.

Aspect 18: The apparatus of aspects 11 through 17, wherein the means for first high-density interconnection includes interconnects with a first width of about 3-4 micrometers or greater and/or a first spacing of about 3-4 micrometers or greater, and wherein the means for second high-density interconnection includes interconnects with a second width of about 3-4 micrometers or greater and/or a second spacing of about 3-4 micrometers or greater.

Aspect 19: The apparatus of aspects 11 through 18, wherein the first integrated device is coupled to the means for first high-density interconnection through a means for first solder interconnection and/or a means for first pillar interconnection, and wherein the second integrated device is coupled to the means for second high-density interconnection through a means for second solder interconnection and/or a means for second pillar interconnection.

Aspect 20: The apparatus of aspects 11 through 19, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating a substrate. The method provides a first carrier comprising a first seed layer. The method forms a first plurality of high-density interconnects over the first seed layer. The method forms a first dielectric layer over the first plurality of high-density interconnects. The method forms a plurality of interconnects in and/or over the first dielectric layer. The method provides a second carrier comprising a second seed layer. The method forms a second plurality of high-density interconnects over the second seed layer. The method couples the second carrier comprising the second seed layer and the second plurality of high-density interconnects, to the first carrier comprising the first seed layer, the first plurality of high-density interconnects, the first dielectric layer and the plurality of interconnects, through a second dielectric layer. The method decouples the second carrier and the first carrier. The method removes portions of the first seed layer and portions of the second seed layer.

Aspect 22: The method of aspect 21, wherein after decoupling the second carrier, the method forms a second plurality of interconnects in and over the second dielectric layer.

Aspect 23: The method of aspects 21 through 22, further forming a solder resist layer over the second plurality of interconnects.

Aspect 24: A package comprising a substrate and a first integrated device coupled to the first surface of the substrate. The substrate includes (i) at least one dielectric layer; (ii) a first plurality of interconnects located in the at least one dielectric layer, wherein the first plurality of interconnects is located through a first surface of the at least one dielectric layer, wherein the first plurality of interconnects comprises a first interconnect located through the first surface of the at least one dielectric layer, and wherein the first interconnect comprises a first interconnect surface, and (iii) a second plurality of interconnects located over the first surface of the at least one dielectric layer, wherein the second plurality of interconnects comprises a second interconnect located over the first surface of the at least one dielectric layer, and wherein the second interconnect comprises a second interconnect surface that is planar to the first interconnect surface.

Aspect 25: The package of aspect 24, wherein the first plurality of interconnects includes a first plurality of high-density interconnects, wherein the first interconnect includes a first high-density interconnect, wherein the first high-density interconnect has a lower first width than a second width of the second interconnect, and wherein the first high-density interconnect has a lower first spacing than a second spacing of the second interconnect.

Aspect 26: The package of aspects 24 through 25, wherein the substrate comprises a third plurality of interconnects located in the at least one dielectric layer, and wherein the third plurality of interconnects is located through a second surface of the at least one dielectric layer.

Aspect 27: The package of aspect 26, further comprising a second integrated device coupled to the second surface of the substrate.

Aspect 28: The package of aspects 26 through 27, wherein the third plurality of interconnects includes a third plurality of high-density interconnects, and wherein the third plurality of high-density interconnects includes a third high-density interconnect, wherein the third high-density interconnect has a lower third width than the second width of the second interconnect, and wherein the third high-density interconnect has a lower third spacing than the second spacing of the second interconnect.

Aspect 29: The package of aspects 26 through 28, wherein the first surface is a top surface and the second surface is a bottom surface.

Aspect 30: The package of aspects 26 through 28, wherein the first surface is a bottom surface and the second surface is a top surface.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
at least one dielectric layer;
a first plurality of interconnects located in the at least one dielectric layer and through a first surface of the at least one dielectric layer, wherein the first plurality of interconnects includes a first width and a first spacing;
a second plurality of interconnects located in the at least one dielectric layer and through a second surface of the at least one dielectric layer, wherein the second plurality of interconnects includes a second width and a second spacing;
a third plurality of interconnects located in the at least one dielectric layer,
wherein the third plurality of interconnects includes a third width that is greater than the first width and the second width, and
wherein the third plurality of interconnects includes a third spacing that is greater than the first spacing and the second spacing,
a first solder resist layer coupled to and touching (i) the first surface of the at least one dielectric layer and (ii) at least one pad interconnect from the first plurality of interconnects that is located in the at least one dielectric layer, and
a second solder resist layer coupled to and touching (i) the second surface of the at least one dielectric layer and (ii) at least one pad interconnect from the second plurality of interconnects that is located in the at least one dielectric layer,
a first integrated device coupled to the first surface of the substrate; and
a second integrated device coupled to the second surface of the substrate.

2. The package of claim 1, A package comprising:
a substrate comprising:
at least one dielectric layer;
a first plurality of interconnects located in the at least one dielectric layer and through a first surface of the at least one dielectric layer, wherein the first plurality of interconnects includes a first width and a first spacing, wherein the first plurality of interconnects includes a first seed layer;
a second plurality of interconnects located in the at least one dielectric layer and through a second surface of the at least one dielectric layer, wherein the second plurality of interconnects includes a second width and a second spacing, wherein the second plurality of interconnects includes a second seed layer;
a third plurality of interconnects located in the at least one dielectric layer,
wherein the third plurality of interconnects includes a third width that is greater than the first width and the second width, and
wherein the third plurality of interconnects includes a third spacing that is greater than the first spacing and the second spacing,
a first solder resist layer coupled to and touching (i) the first surface of the at least one dielectric layer and (ii) the first seed layer of the first plurality of interconnects,
a second solder resist layer coupled to and touching (i) the second surface of the at least one dielectric layer and (ii) the second seed layer of the second plurality of interconnects,
a first integrated device coupled to the first surface of the substrate, wherein the first integrated device is coupled to the first plurality of interconnects through a first plurality of solder interconnects and/or a first plurality of pillar interconnects, and a second integrated device coupled to the second surface of the substrate, wherein the second integrated device is coupled to the second plurality of interconnects through a second plurality of solder interconnects and/or a second plurality of pillar interconnects.

3. The package of claim 1,
wherein the first plurality of interconnects is located on a first metal layer of the substrate, and
wherein the second plurality of interconnects is located on a next to last metal layer of the substrate.

4. The package of claim 1,
wherein the first plurality of interconnects is located on a first metal layer in the at least one dielectric layer, and
wherein the second plurality of interconnects is located on a last metal layer embedded in the at least one dielectric layer.

5. The package of claim 1,
wherein the substrate includes a fourth plurality of interconnects located over the first surface of the at least one dielectric layer,
wherein the fourth plurality of interconnects are located on a metal layer outside of the at least one dielectric layer, and
wherein the first solder resist layer is coupled to and touching the fourth plurality of interconnects.

6. The package of claim 1,
wherein the substrate includes a fourth plurality of interconnects located over the second surface of the at least one dielectric layer,
wherein the fourth plurality of interconnects are located on a metal layer that is outside of the at least one dielectric layer, and
wherein the second solder resist layer is coupled to and touching the fourth plurality of interconnects.

7. The package of claim 1,
wherein the first plurality of interconnects includes a first minimum width of about 3-4 micrometers and/or a first minimum spacing of about 3-4 micrometers, and
wherein the second plurality of interconnects includes a second minimum width of about 3-4 micrometers and/or a second minimum spacing of about 3-4 micrometers.

8. The package of claim 1,
wherein the first width is about 3-4 micrometers or greater and/or the first spacing is about 3-4 micrometers or greater, and
wherein the second width is about 3-4 micrometers or greater and/or the second spacing is about 3-4 micrometers or greater.

9. The package of claim 1, wherein the first integrated device is coupled to the first plurality of interconnects through a first plurality of solder interconnects and/or a first plurality of pillar interconnects.

10. The package of claim 9, wherein the second integrated device is coupled to the second plurality of interconnects through a second plurality of solder interconnects and/or a second plurality of pillar interconnects.

11. An apparatus comprising:
a substrate comprising:
at least one dielectric layer;
means for first high-density interconnection located in the at least one dielectric layer and through a first surface of the at least one dielectric layer; and
means for second high-density interconnection located in the at least one dielectric layer and through a second surface of the at least one dielectric layer;
a first solder resist layer coupled to and touching (i) the first surface of the at least one dielectric layer and (ii) at least one pad interconnect from the means for first high-density interconnection that is located in the at least one dielectric layer,
a second solder resist layer coupled to and touching (i) the second surface of the at least one dielectric layer and (ii) at least one pad interconnect from the means for second high-density interconnection that is located in the at least one dielectric layer,
a first integrated device coupled to the first surface of the substrate; and
a second integrated device coupled to the second surface of the substrate.

12. The apparatus of claim 11,
wherein the first integrated device is coupled to the means for first high-density interconnection,
wherein the means for first high-density interconnection includes a first seed layer coupled to and touching the first solder resist layer,
wherein the second integrated device is coupled to the means for second high-density interconnection, and
wherein the means for second high-density interconnection includes a second seed layer coupled to and touching the second solder resist layer.

13. The apparatus of claim 11,
wherein the means for first high-density interconnection is located on a first metal layer of the substrate, and
wherein the means for second high-density interconnection is located on a next to last metal layer of the substrate.

14. The apparatus of claim 11,
wherein the means for first high-density interconnection is located on a first metal layer in the at least one dielectric layer, and
wherein the means for second high-density interconnection is located on a last metal layer embedded in the at least one dielectric layer.

15. The apparatus of claim 11, wherein the substrate includes means for interconnection located over the first surface of the at least one dielectric layer.

16. The apparatus of claim 11, wherein the substrate includes means for interconnection located over the second surface of the at least one dielectric layer.

17. The apparatus of claim 11,
wherein the means for first high-density interconnections includes first interconnects with a first minimum width of about 3-4 micrometers and/or a first minimum spacing of about 3-4 micrometers, and
wherein the means for second high-density interconnection includes second interconnects with a second minimum width of about 3-4 micrometers and/or a second minimum spacing of about 3-4 micrometers.

18. The apparatus of claim 11,
wherein the means for first high-density interconnection includes first interconnects with a first width of about 3-4 micrometers or greater and/or a first spacing of about 3-4 micrometers or greater, and
wherein the means for second high-density interconnection includes second interconnects with a second width of about 3-4 micrometers or greater and/or a second spacing of about 3-4 micrometers or greater.

19. The apparatus of claim 11,
wherein the first integrated device is coupled to the means for first high-density interconnection through a means for first solder interconnection and/or a means for first pillar interconnection, and wherein the second integrated device is coupled to the means for second high-density interconnection through a means for second solder interconnection and/or a means for second pillar interconnection.

20. The apparatus of claim 11, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

21. A method for fabricating a substrate, comprising:
providing a first carrier comprising a first seed layer;
forming a first plurality of high-density interconnects over the first seed layer;
forming a first dielectric layer over the first plurality of high-density interconnects;
forming a plurality of interconnects in and/or over the first dielectric layer;
providing a second carrier comprising a second seed layer;
forming a second plurality of high-density interconnects over the second seed layer;
coupling the second carrier comprising the second seed layer and the second plurality of high-density interconnects, to the first carrier comprising the first seed layer, the first plurality of high-density interconnects, the first dielectric layer and the plurality of interconnects, through a second dielectric layer;
decoupling the second carrier and the first carrier; and
removing portions of the first seed layer and portions of the second seed layer.

22. The method of claim 21, wherein after decoupling the second carrier, further comprising forming a second plurality of interconnects in and over the second dielectric layer.

23. The method of claim 21, further forming a solder resist layer over the second plurality of high-density interconnects.

* * * * *